(12) United States Patent
Jin et al.

(10) Patent No.: US 9,012,269 B2
(45) Date of Patent: Apr. 21, 2015

(54) REDUCING WARPAGE FOR FAN-OUT WAFER LEVEL PACKAGING

(75) Inventors: Yonggang Jin, Singapore (SG); Xavier Baraton, Singapore (SG); Faxing Che, Singapore (SG)

(73) Assignee: STMicroelectronics PTE Ltd., Singapore (SG)

( * ) Notice: Subject to any disclaimer, the term of this patent is extended or adjusted under 35 U.S.C. 154(b) by 33 days.

(21) Appl. No.: 13/488,276

(22) Filed: Jun. 4, 2012

(65) Prior Publication Data
US 2012/0244664 A1 Sep. 27, 2012

Related U.S. Application Data

(62) Division of application No. 12/495,734, filed on Jun. 30, 2009, now abandoned.

(60) Provisional application No. 61/141,449, filed on Dec. 30, 2008.

(51) Int. Cl.
*H01L 21/56* (2006.01)
*H01L 23/31* (2006.01)
(Continued)

(52) U.S. Cl.
CPC .......... *H01L 23/3128* (2013.01); *H01L 21/561* (2013.01); *H01L 21/565* (2013.01); *H01L 21/568* (2013.01); *H01L 23/5389* (2013.01); *H01L 24/19* (2013.01); *H01L 24/96* (2013.01); *H01L 24/97* (2013.01); *H01L 2224/04105* (2013.01); *H01L 2224/20* (2013.01); *H01L 2224/97* (2013.01); *H01L 2924/01013* (2013.01); *H01L 2924/01029* (2013.01); *H01L 2924/01047* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/14* (2013.01); *H01L 2924/1433* (2013.01); *H01L 2924/15311* (2013.01); *H01L 2924/01005* (2013.01);
(Continued)

(58) Field of Classification Search
CPC ....... H01L 21/56; H01L 23/02; H01L 23/498; H01L 23/48; H01L 21/02
USPC .......... 438/127, 106, 108, 112, 121, 124, 125
See application file for complete search history.

(56) References Cited

U.S. PATENT DOCUMENTS

| 4,612,601 A | 9/1986 | Watari |
| 5,288,944 A | 2/1994 | Bronson et al. |

(Continued)

OTHER PUBLICATIONS

"COB IC's", retrieved from http://www.engineersgarage.com/articles/cob-ics, retrieved on Dec. 17, 2012, 12 pages.
(Continued)

*Primary Examiner* — Chuong A Luu
(74) *Attorney, Agent, or Firm* — Seed IP Law Group PLLC

(57) ABSTRACT

Fan-out wafer level packaging includes an integrated circuit having a top surface, a bottom surface, a plurality of side surfaces, and a bond pad defined on the top surface. A layer of encapsulant substantially surrounds the side surfaces of the integrated circuit, the layer of encapsulant having a height substantially equal to a height of the integrated circuit. A bump is spaced apart from the integrated circuit, and a redistribution layer electrically couples the bond pad of the integrated circuit to the bump.

11 Claims, 8 Drawing Sheets

(51) Int. Cl.
*H01L 23/538* (2006.01)
*H01L 23/00* (2006.01)

(52) U.S. Cl.
CPC ........... *H01L2924/01006* (2013.01); *H01L 2924/01019* (2013.01); *H01L 2924/01024* (2013.01); *H01L 2924/01033* (2013.01); *H01L 2924/014* (2013.01); *H01L 2924/10253* (2013.01)

(56) References Cited

U.S. PATENT DOCUMENTS

| | | | |
|---|---|---|---|
| 6,087,202 A | 7/2000 | Exposito et al. | |
| 6,270,019 B1 | 8/2001 | Reighard | |
| 6,423,570 B1 | 7/2002 | Ma et al. | |
| 6,706,553 B2 | 3/2004 | Towle et al. | |
| 6,800,941 B2 | 10/2004 | Lee et al. | |
| 6,902,950 B2 | 6/2005 | Ma et al. | |
| 6,930,378 B1 * | 8/2005 | St. Amand et al. | 257/686 |
| 7,459,781 B2 | 12/2008 | Yang et al. | |
| 7,888,172 B2 | 2/2011 | Huang | |
| 7,947,530 B2 | 5/2011 | Kim et al. | |
| 8,106,504 B2 | 1/2012 | Yang | |
| 2002/0068453 A1 * | 6/2002 | Grigg et al. | 438/690 |
| 2004/0046254 A1 | 3/2004 | Lin et al. | |
| 2005/0148160 A1 | 7/2005 | Farnworth et al. | |
| 2005/0275081 A1 * | 12/2005 | Chang | 257/690 |
| 2006/0035415 A1 | 2/2006 | Wood et al. | |
| 2007/0224733 A1 | 9/2007 | Boyle et al. | |
| 2007/0231469 A1 | 10/2007 | Lin et al. | |
| 2009/0221114 A1 * | 9/2009 | Xu | 438/113 |
| 2010/0244208 A1 | 9/2010 | Pagaila et al. | |
| 2011/0156239 A1 | 6/2011 | Jin | |
| 2011/0278741 A1 | 11/2011 | Chua et al. | |
| 2012/0074592 A1 | 3/2012 | Luan | |

OTHER PUBLICATIONS

"Definition of: chip on board", retrieved from http://www.pcmag.com/encyclopedia_term/0.1237.t=chip+on+board&i=39643.00.asp, retrieved on Dec. 17, 2012, 1 page.

"Electronics Packaging Technology Update: BGA, CSP, DCA and Flip Chip", retrieved from http://www.emeraldinsight.com/journals.htm?articleid=1455546&show=html, retrieved on Dec. 17, 2012, 1 page.

* cited by examiner

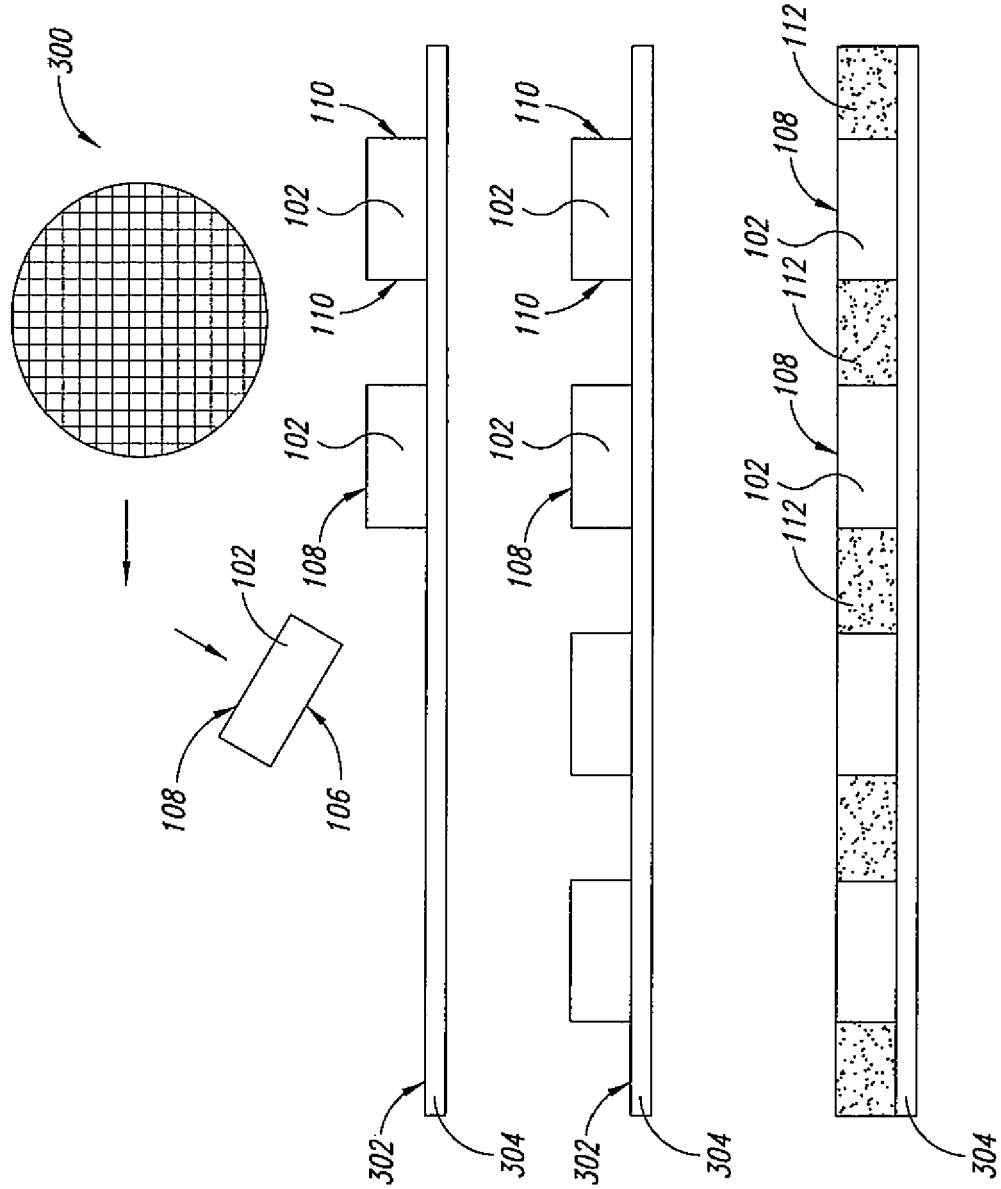

REDUCING WARPAGE FOR FAN-OUT WAFER LEVEL PACKAGING

CROSS-REFERENCE TO RELATED APPLICATIONS

This application is a divisional of U.S. patent application Ser. No. 12/495,734, filed Jun. 30, 2009, now pending, which claims the benefit under 35 U.S.C. §119(e) of U.S. Provisional Patent Application No. 61/141,449, filed Dec. 30, 2008, where these applications are incorporated herein by reference in their entireties.

BACKGROUND

1. Technical Field

This description generally relates to the field of chip packaging, and more particularly to fan-out wafer level packaging.

2. Description of the Related Art

Redistributing the bond pads of integrated circuits ("ICs") in chip packages is becoming increasingly common. In general, the redistribution process converts peripheral wire bond pads on an IC to an area array of solder bumps via a redistribution layer. The resulting fan-out wafer level packaging may have a larger solder bump bonding area and may be more easily integrated into electronic devices and larger chip packages.

Referring to FIG. 1, conventional fan-out wafer level packaging is illustrated. Conventionally, a backside of an IC 2 is first encapsulated in a molding compound 1. A plurality of dielectric layers 4 and redistribution layers 3 are then deposited on a front side of the IC 2 to form electrical connections between wire bond pads 7 on the IC 2 and redistributed solder bump bond pads 5. Finally, solder bumps 6 are formed at the redistributed bond pad locations 5, and the fan-out wafer level packaging is ready to be soldered to a printed circuit board.

FIG. 2 illustrates the encapsulation process as applied to a plurality of ICs 2 arranged on a surface, such as a tape 8 on a carrier 9. The mold compound 1 is dispensed centrally on the tape 8 at a thickness sufficient to completely cover all exposed surfaces of each IC 2. The ICs 2 are placed in a mold chase 10 that is configured to compress the molding compound 1 down and around all of the ICs 2. A large amount of molding compound 1 is required to ensure that all side surfaces and the backside of each IC 2 is completely covered.

As shown in FIG. 3, prior to compressing the mold compound 1 down around the ICs 2 a protective film 11 is arranged over the molding compound 1 and across exterior edges 12, 13 of the mold chase. The protective film 11 decreases the amount of compressive force applied to the ICs 2. Subsequently, the molding compound 1 is compressed down and spreads around each of the ICs 2.

Unfortunately, after employing such packaging methods, the backside of the IC 2 is typically covered by a relatively thick layer of the molding compound 1, as illustrated in FIG. 1. As a result, this can result in increased warping of the packaging due to coefficient of thermal expansion mismatch, and the thickness of the packaging.

There remains a need in the art, therefore, for an improved method of manufacturing fan-out wafer level packaging.

BRIEF SUMMARY

A method of packing a die in which an encapsulation layer is formed around the four sides of an integrated circuit and is not formed on the front side or the back side, thus providing a package die in which an inactive surface of the integrated circuit is not covered by the encapsulation layer. Integrated circuits are often packaged in encapsulation layers, such as molding compounds, to protect the circuit elements. The front side has bonding pads on the integrated circuits coupled to soldering bumps for future connection to a larger circuit, such as a motherboard of a computer, whereas the backside is exposed or has a thin layer of epoxy covering it.

According to one embodiment of the present disclosure, an integrated circuit is first placed on an adhesive tape. An active surface of the integrated surface adheres to the tape so that the inactive surface is exposed, extending away from the tape. The tape is not rigid, but rather flexible and may act as a cushion for the integrated circuit. The tape is attached to a rigid carrier that supports the tape having the integrated circuit for transportation between processes. The tape and the carrier are attached in a manner that allows the two pieces to move as one.

A molding chamber is provided that is sized and shaped to receive the integrated circuit attached to the tape and carrier. A molding compound is melted in the molding chamber. Subsequently, the carrier and tape combination is turned over so the inactive surface of the integrated circuit contacts the molding compound in the molding chamber first. The carrier and tape are then compressed to press the integrated circuit into the molding compound.

A protective layer lines the interior surfaces of the molding chamber. The protective layer may be plastic or any material that is flexible and not rigid. The integrated circuit is compressed into the molding chamber until the inactive surface contacts the protective layer. Both the tape and the protective layer prevent damage to the integrated circuit by absorbing the compressive stress.

A method of manufacturing fan-out wafer level packaging is disclosed. The method comprises: positioning an integrated circuit on a first surface; forming a layer of encapsulant on the first surface substantially surrounding the integrated circuit, the layer of encapsulant having a height substantially equal to a height of the integrated circuit; forming a redistribution layer configured to electrically couple a bond pad of the integrated circuit to a redistributed bond pad; and forming a bump at the redistributed bond pad.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn, are not intended to convey any information regarding the actual shape of the particular elements, and have been solely selected for ease of recognition in the drawings.

FIGS. 5 and 6 illustrate a first plurality of processing acts that may be used in manufacturing the fan-out wafer level packaging of FIG. 4, according to one embodiment.

DETAILED DESCRIPTION OF EMBODIMENTS OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures and methods associated with integrated circuits and semiconductor manufacturing/packaging processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the embodiments.

Description of An Exemplary Fan-out Wafer Level Packaging

Figure 4:
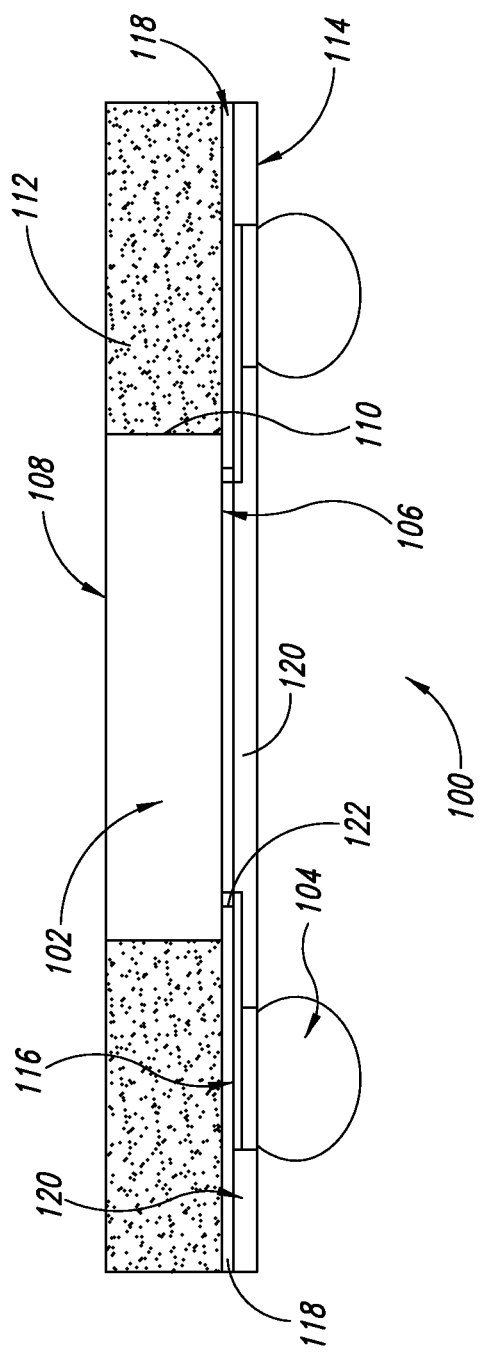
FIG. 4 is a cross-sectional, side, schematic view of fan-out wafer level packaging, according to one embodiment.

FIG. 4 shows fan-out wafer level packaging 100, according to one illustrated embodiment. The fan-out wafer level packaging 100 may be configured to at least partially protect an integrated circuit 102 from the external environment. In other embodiments, the fan-out wafer level packaging 100 is configured to include a plurality of bumps 104 electrically coupled to the integrated circuit 102, and the fan-out wafer level packaging 100 may thus enable electrical connections to be formed between the integrated circuit 102 and external circuitry. In other embodiments, other electrically conductive structures may be formed along an external surface of the fan-out wafer level packaging 100 in order to enable such electrical connections with the integrated circuit 102.

The integrated circuit 102 includes a variety of electronic circuitry. For example, the integrated circuit 102 may comprise a controller for an electronic computing device, or a computer-readable memory. In different embodiments, the integrated circuit 102 may be formed using any of a variety of semiconductor fabrication processes. In one embodiment, the integrated circuit 102 is defined by layers of semi-conducting, dielectric and conducting materials deposited onto a semiconductor substrate in accordance with pre-defined patterns.

Recent integrated circuits can use different materials for the integrated circuit construction than previously used. For many years, standard silicon dioxide, silicon nitride, and polysilicon layers were used to construct various interconnection layers between the substrate and the operational transistors that formed the integrated circuit. Initial circuits made some years ago had one or two layers of polysilicon on top of which may be one or two layers of metal. Recent advances in semiconductor technology have drastically increased the complexity of integrated circuits. Many circuits may have between two and five layers of polysilicon and between seven and twelve layers of metal above the polysilicon layers. Further, the size of the minimum gate width of transistors has shrunk dramatically with transistors in the range of 65 nm, 45 nm, and 32 nm becoming common. Future transistor sizes may approach 20 or 18 nm for the gate length.

Another improvement further increasing the complexity is the use of many different types of dielectric layers between the substrate and the first metal layer and between various metal layers. For example, an uppermost polysilicon layer may be positioned over a plurality of insulating layers, which can include various nitride and oxide layers as well as a plurality of additionally polysilicon layers separated from each other by various sublayers of silicon nitride, silicon dioxide, and other types of insulators. Additionally, metal layers may be formed with a premetal dielectric layer composed of a plurality of sublayers. In small geometry silicon chips, such as 90 nm and smaller, the premetal dielectrics are usually made of a low-k material. This low-k material may be an aerogel, a nanoporous dielectric, or other extremely low-k dielectric material. The low-k dielectric layers may be composed of a plurality of low-k dielectric layers and followed by yet another metal layer. This continues for many layers and sublayers.

In the prior art, dielectric layers between the various metal layers may be composed of one or perhaps two glass layers, such as a spin-on glass, a silicon dioxide glass, or other strong layers which had high adhesive properties, and bonded strongly to each other. On the other hand, the more modern chips, use dielectric materials which have numerous small pockets of air distributed throughout in order to reduce the dielectric constant. Such low-k dielectric materials are not as structurally strong as a more solid glass, such as a spin-on glass or a solid silicon dioxide glass. In addition, these layers often contain chemical compositions which do not stick as tightly to each other as the prior art glasses. Such dielectric compounds may contain various combinations of carbon, fluoride, hydrogen, and other elements to increase the porosity and reduce the dielectric constant. These low-k dielectrics provide enhanced electrical performance, but the structural integrity is substantially less than was provided in prior art semiconductor devices. In addition, the adhesive bonding strength between the various layers is reduced.

Repeated cycles of heating and cooling are problematic to the structural integrity of integrated circuits with many low-k dielectric layers. When the integrated circuit 102 is heated or cooled, it expands or shrinks according to a coefficient of thermal expansion (CTE) particular to the material of the integrated circuit 102. Each dielectric layer may have a slightly different CTE coefficient of expansion during heating. A material with a high CTE will expand or shrink more than a material with a lower CTE under a given increase or decrease in temperature. When the package is heated or cooled, the molding compound, the integrated circuit 102, the substrate, and the sublayers expand or contract differently from each other. This disparity in expansion causes the integrated circuit 102 to experience compressive, expansive, and tensile forces. The stress is felt more intensely at the edges and corners of the integrated circuit 102. The repeated cycles of expansion and contraction may eventually cause layers in the integrated circuit to warp and separate. If a crack propagates from the inactive surface to the integrated circuitry, the crack can be fatal to the functionality of the integrated circuit.

The repeated stresses may also cause delamination of the layers in the integrated circuit 102. Delamination is the separation or unbonding of any of the layers, sublayers, or components of the integrated circuit 102. For example, under stress, the adhesion between the various layers in integrated circuit 102 may fail. Delamination between any of the components can damage functionality of the integrated circuit.

The stresses also cause warping of the integrated circuit 102. The stress of the expansion and contraction of the components of the package can cause curvature of the integrated circuit 102. This curvature, which is focused at the edges and corners of the integrated circuit 102, can result in poor solder joint formation in certain kinds of packages. Furthermore, the curvature can result in a loss of functionality of the integrated circuit 102.

In applications where a small dielectric constant is needed (low k applications), a porous silicon is often used as a dielectric between circuit components and layers of the integrated circuit. The porous silicon is particularly prone to fracturing under stress. Any warping of the integrated circuit 102 can cause fracturing of the porous silicon. Compressive forces of contraction and expansion may also cause the porous silicon to fracture. This fracturing can damage functionality of the integrated circuit.

The effects of thermo-mechanical stress are greater with larger integrated circuit 102 size. With system on chip (SOC) technology, integrated circuit 102 sizes increase due to the number of systems being integrated into one integrated circuit. Stress at the corners and edges of a larger integrated circuit 102 cause greater torque on the integrated circuit 102 and can more easily cause cracking, warping, or delamination of the integrated circuit 102. The present invention is designed to prevent these problems in the large integrated circuit 102s having low-k dielectrics.

As illustrated, the integrated circuit 102 includes a front or top surface 106 and a back side or bottom surface 108. Of course, the terms, top and bottom, should not be understood to imply any absolute positioning of the integrated circuit 102, rather, front or top refers to the surface having the circuits therein and the back side or bottom is the other side of pure silicon. The back side 108 is exposed in the final package in one embodiment; in other embodiments it may have a thin layer of silicon carbide, resin or an epoxy or other passivation layer. Having the back side 108 exposed or having a thin covering of resin, epoxy or the like ensures reduced stress due to a thermal mismatch of the package holding the die. The packing resin material 112 will have a different Coefficient of Thermal Expansion, CTE, from the die 102, by having a small amount of resin on the sides and either a thin or no layer on the back side, stress caused by differences in CTE of the different materials is kept low.

Figure 2:
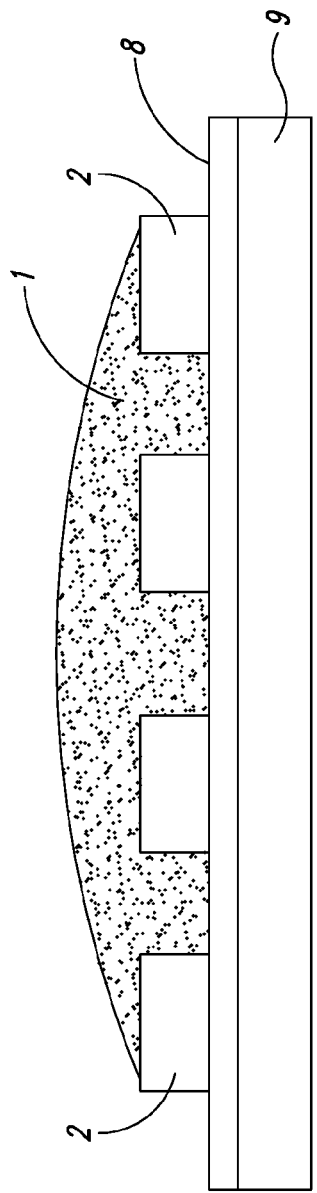
FIGS. 2 and 3 are cross-sectional side views of a prior art process of forming the wafer level packaging of FIG. 1.
Figure 3:
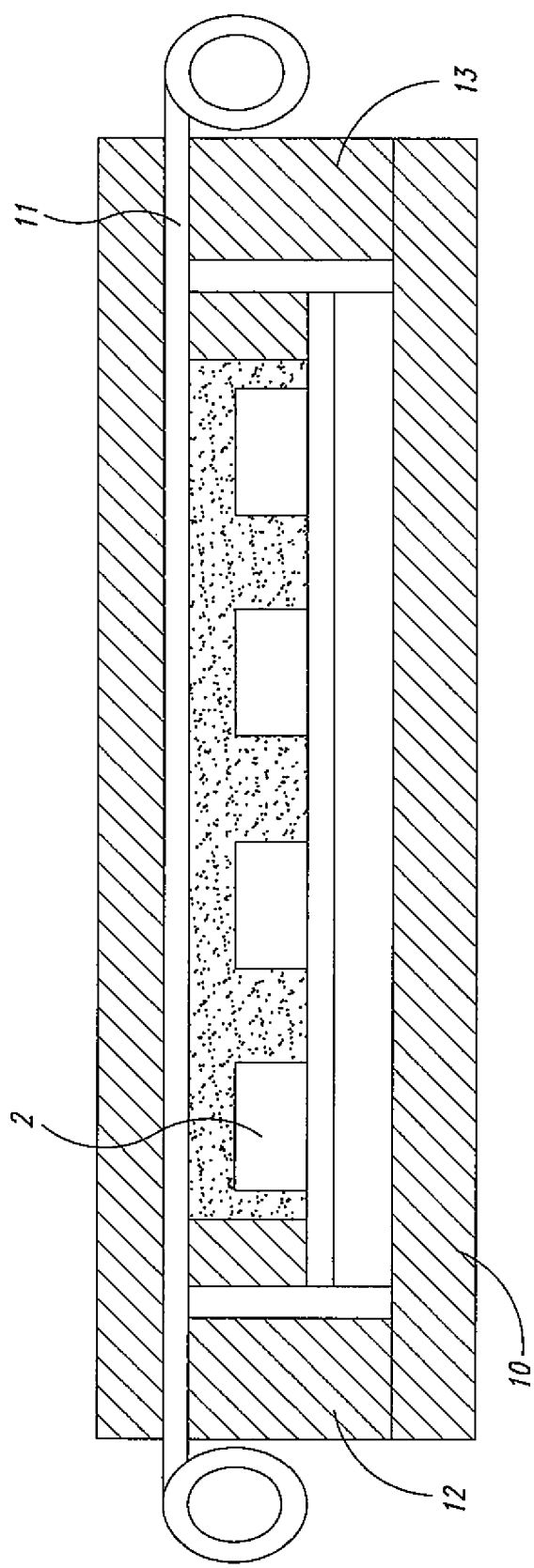

The integrated circuit 102 may further include a plurality of side surfaces 110. Although not visible in FIG. 2, the integrated circuit 102 may further include one or more bond pads defined on the top surface 106. The number of bond pads may vary greatly depending upon the particular application for the integrated circuit 102. For example, controller circuitry may require more bond pads defining input/outputs than memory circuitry. The bond pads may comprise any type of conducting material, such as copper, silver, or gold.

The integrated circuit 102 may have any of a variety of shapes and sizes. In one embodiment, the integrated circuit 102 has a generally rectilinear top surface 106. For example, the top surface 106 may have a generally square shape, and thus the integrated circuit 102 may include four side surfaces 110. In other embodiments, more irregular shapes may define the integrated circuit 102.

The fan-out wafer level packaging 100 may further comprise a layer of encapsulant 112 substantially surrounding the side surfaces 110 of the integrated circuit 102. The layer of encapsulant 112 may comprise any of a variety of encapsulants, such as a molding compound. In one embodiment, the encapsulant comprises a dielectric material that serves to electrically insulate as well as at least partially protect the integrated circuit 102 from the external environment.

The layer of encapsulant 112, like the integrated circuit 102, may have any of a variety of shapes and sizes. As illustrated, the layer of encapsulant 112 has a height substantially equal to a height of the integrated circuit 102. In one embodiment, the layer of encapsulant 112 has a height that is less than 20% greater than a height of the integrated circuit 102. In other embodiments, the height of the layer of encapsulant 112 is less than 10% greater than the height of the integrated circuit 102. In still other embodiments, the height of the layer of encapsulant 112 is equal to the height of integrated circuit 102. In one embodiment, by making the height of the layer of encapsulant 112 substantially equal to the height of the integrated circuit 102, the potential for warpage can be substantially reduced. The layer of encapsulant 112 may further have a generally rectilinear outer perimeter, such that the shape of the layer of encapsulant 112 and the shape of the integrated circuit 102 are geometrically similar.

The fan-out wafer level packaging 100 may further include one or more bumps 104 positioned proximate a top surface 114 of the fan-out wafer level packaging 100. Each of these bumps 104 is spaced apart from the integrated circuit 102, but may be electrically coupled thereto. The bumps 104 may comprise any of a variety of solder bumps formed from different materials. In one embodiment, the bumps 104 comprise lead-free solder bumps, while, in other embodiments, the bumps 104 include lead as well as other conductive materials, such as tin. Although two bumps 104 are visible in the cross-section of FIG. 2, more bumps 104 are incorporated into the fan-out wafer level packaging 100 in different embodiments. For example, in some embodiments, at least one bump 104 may correspond to each bond pad defined on the top surface 106 of the integrated circuit 102.

The bumps 104 may also have any of a variety of sizes. In one embodiment, the bumps 104 have diameters of between 10 and 200 μm, depending upon their composition, as well as the processes used to form them.

The fan-out wafer level packaging 100 may further include a redistribution layer 116, also called a wiring layer or solder ball to bond pad coupling layers, configured to electrically couple a bond pad of the integrated circuit 102 to a corresponding bump 104. The redistribution layer 116 may comprise any of a variety of electrically conductive materials defining at least part of an electrical path between particular bond pads of the integrated circuit 102 and corresponding bumps 104. For example, the redistribution layer 116 may comprise copper or gold in some embodiments.

In one embodiment, as illustrated in FIG. 4, the redistribution layer 116 itself may include redistributed bond pads (located directly underneath corresponding bumps 104), and the bumps 104 may be in direct contact with the redistribution layer 116. However, in other embodiments, redistributed bond pads may be formed atop the redistribution layer 116 (as discussed in greater detail below), and the bumps 104 may be coupled thereto.

The redistribution layer 116 may have any of a variety of thicknesses. In one embodiment, the redistribution layer 116 may be between 1 and 10 μm thick. Such a substantial thickness may facilitate the use of the redistribution layer 116 itself as a redistributed bond pad with lead-free bumps. In other embodiments, the redistribution layer 116 may be at least 1 μm thick. In such embodiments, it may be desirable to use the redistribution layer 116 with a separate redistributed bond pad to form the final interface with a corresponding bump 104.

The fan-out wafer level packaging 100 may further include dielectric layers 118, 120. Such dielectric layers 118, 120 may add structural integrity to the fan-out wafer level packaging 100, while keeping conductive elements of the fan-out wafer level packaging 100 electrically insulated from one another. In one embodiment, a first dielectric layer 118 extends at least partially over the top surface 106 of the integrated circuit 102. The first dielectric layer 118 may define at least one bond pad via, through which the redistribution layer 116 may contact a corresponding bond pad of the integrated circuit 102. Two such bond pad vias are illustrated in the cross-sectional view of FIG. 4. Of course, in other embodiments, more or fewer bond pad vias may be defined.

In one embodiment, a second dielectric layer 120 extends at least partially over the redistribution layer 116. The second dielectric layer 120 may define at least one redistribution via therethrough that extends to the redistribution layer 116. Two such redistribution vias are illustrated in the cross-sectional view of FIG. 2. Of course, in other embodiments, more or fewer redistribution vias may be defined. In one embodiment, each redistribution via through the second dielectric layer 120 may correspond to exactly one bond pad via through the first dielectric layer 118.

In one embodiment, the first dielectric layer 118 and the second dielectric layer 120 comprise the same dielectric material. For example, a photosensitive polymer, such as polyimide, polybenzoxazole or solder resist, may be used to define both the first dielectric layer 118 and the second dielectric layer 120. In other embodiments, different materials may be used to define the two dielectric layers 118, 120.

The first dielectric layer 118 may have any of a variety of thicknesses. In one embodiment, the first dielectric layer 118 may be between approximately 5 and 10 μm thick, as measured from the top surface 106 of the integrated circuit 102 to the redistribution layer 116. The second dielectric layer 120 may also be formed to define any of a variety of thicknesses. In one embodiment, a thickness of the second dielectric layer 120 may be greater than 2 μm added to a thickness of the redistribution layer 116.

Description of An Exemplary Method For Manufacturing Fan-out Wafer Level Packaging FIGS. 5-13 illustrate different processing acts that may be used in a method of manufacturing fan-out wafer level packaging, according to one embodiment. This method will be discussed in the context of the fan-out wafer level packaging 100 of FIG. 4. However, it may be understood that the acts disclosed herein may also be executed to manufacture a variety of differently configured fan-out wafer level packaging, in accordance with the described method.

As described herein, all of the acts comprising the method may be orchestrated by a manufacturing processor or controller based at least in part on execution of computer-readable instructions stored in memory. In other embodiments, a hardware implementation of all or some of the acts of the manufacturing method may be used.

First, a plurality of integrated circuits 102 may be formed by any of a variety of manufacturing processes. In one embodiment, as illustrated in FIG. 5, a wafer 300 including a plurality of integrated circuits 102 is provided. The wafer 300 may be processed in accordance with a variety of semiconductor processing techniques to form the integrated circuits 102, and, in one embodiment, each of the integrated circuits 102 defined within the wafer 300 may be similarly configured. The wafer 300 may then be divided (e.g. by laser-cutting or die sawing) to define the individual integrated circuits 102. Although illustrated as round, the wafer 300 may also comprise a square panel ranging in size from 8"×8" up to 12"×12".

Once separated, the integrated circuits 102 may be positioned on a surface 302 of a backing 304. The backing 304 may comprise any of a variety of surfaces, and, in one embodiment, the backing 304 may comprise an adhesive surface of a piece of tape. In one embodiment, only a single integrated circuit 102 may be positioned on the piece of tape; however, in other embodiments, as illustrated, a plurality of integrated circuits 102 may be positioned in an array thereon.

The integrated circuits 102 may be placed atop the surface 302 in a variety of ways. For example, in one embodiment, a robotic end effector may be used to properly position the integrated circuits 102. In another embodiment, a human operator places the integrated circuit 102 manually or by a user-controlled machine. The integrated circuits 102 may be positioned with the top surface 106 of the integrated circuits 102 facing the surface 302. The top surface 106 may correspond to the area of the integrated circuit 102 that contains active regions as opposed to a silicon substrate. The integrated circuits 102 are spaced on the surface 302 by a predetermined distance to ensure sufficient space for singulating the ICs later in the process.

A layer of encapsulant 112 may then be formed on the first surface 302 substantially surrounding the integrated circuits 102, as shown in FIG. 6. The layer of encapsulant 112 has a height substantially equal to a height of the integrated circuits 102. The layer of encapsulant 112 may be formed by any of a variety of manufacturing processes.

Figure 7A:
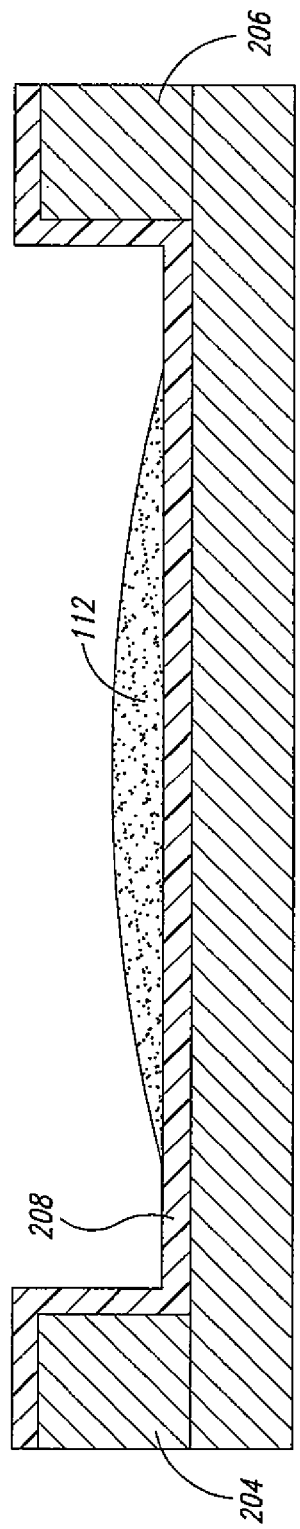
FIGS. 7A-7C illustrate an encapsulation process in accordance with one embodiment.
Figure 7B:
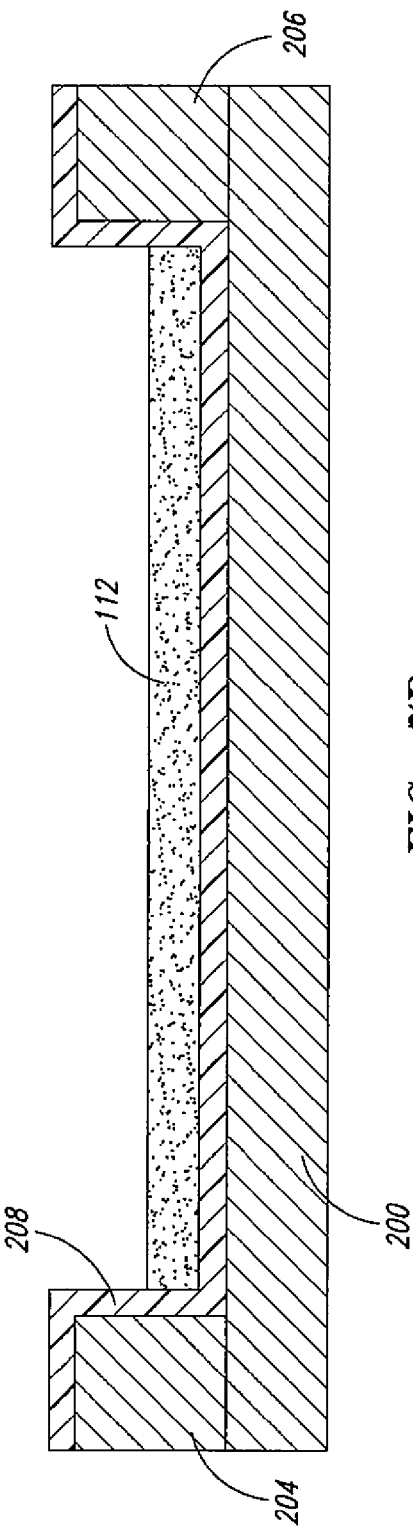
Figure 7C:
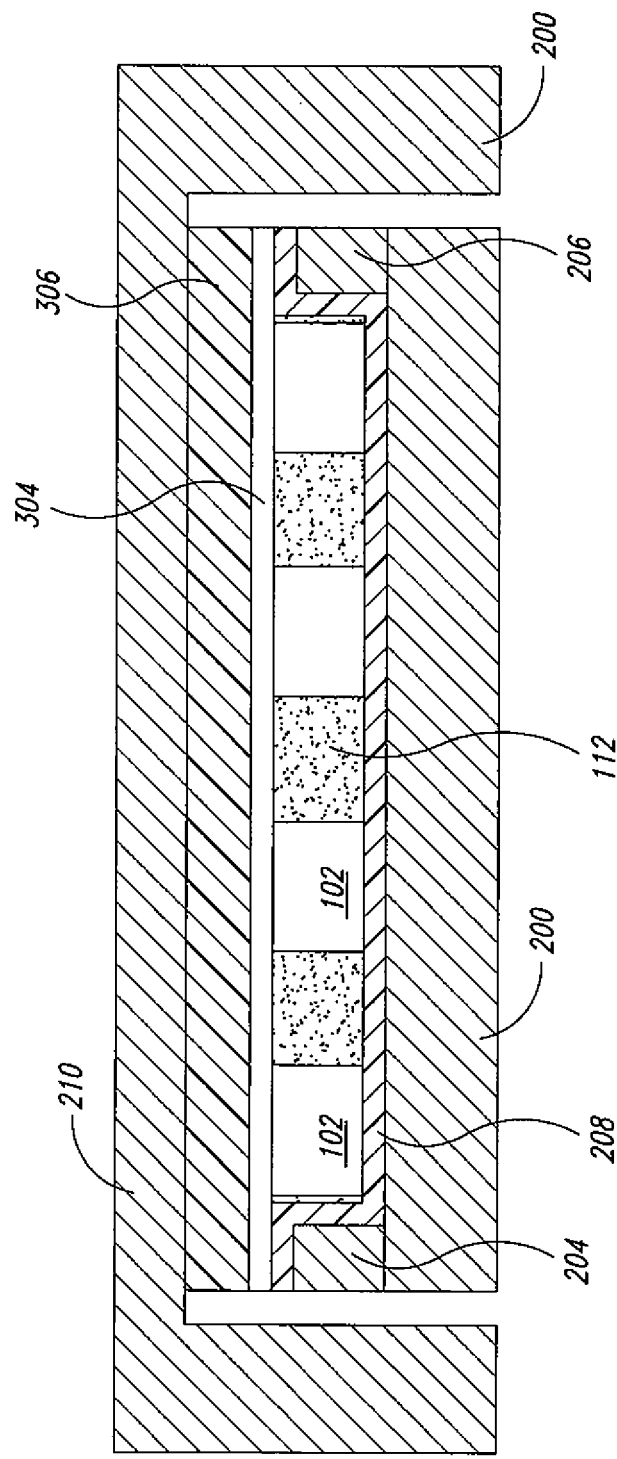

FIGS. 7A-7C illustrate a manufacturing process for forming the encapsulation layer 112 of a height substantially similar to the height of the IC 102. A predetermined amount of encapsulant 112 is placed on a protective layer 208 in a mold chase 200. The protective layer 208 may be formed of plastic or other material that is not rigid. The protective layer 208 is configured to depress or otherwise cushion the inactive surface, i.e. the bottom surface 108, of the integrated circuit 102 when the inactive surface is compressed onto the protective layer 208, as described below.

The encapsulant 112 may be a molding compound or a molding resin. The encapsulant 112 may be in a liquid or a powder form. The mold chase 200 may be formed of metal and is configured to heat the powder to a liquid form. If the encapsulant is initially liquid, the mold chase 200 is configured to maintain the liquid at a specific temperature in preparation for application to the ICs 102. For example, the liquid encapsulant 112 may be kept at a temperature of 120 to 150 degrees Celsius. Additionally, the encapsulant may be used that is liquid at lower temperature and subsequently form crosslinks at higher temperatures. The crosslinks may cause the encapsulant to withstand more heat after initial solidification so that the encapsulant does not re-melt if the IC 102 operates at a temperature higher than 120 degrees Celsius.

FIG. 7B illustrates the encapsulant in a molten form, evenly disbursed across the entire mold chase 200. The protective layer 208, which may be plastic, completely covers all interior surfaces of the mold chase 200 including top and side surfaces of walls 204 and 206. The protective layer 208 prevents the ICs 102 from contacting the hard metal surfaces of the mold chase 200. In one embodiment, the protective layer 208 is 100 microns thick.

FIG. 7C illustrates the compressive molding of the encapsulant 112 around the side surfaces 110 of the ICs 102. The backing 304 may be applied to a carrier layer 306 before or after the ICs 102 are arranged on the surface 302. As mentioned above, the backing 304 may be an adhesive tape that is elastic or otherwise flexible. The active surface of the integrated circuit, i.e., the top surface 106, is positioned on the backing 304. The carrier layer 306 may be a plexiglass plate and may provide support for the backing. In addition, the carrier layer 306 allows for transport of the ICs 102 to the mold chase 200. The carrier layer 306 allows for the backing 304 and ICs 102 to be turned over so that the bottom surfaces 108 of the ICs 102 enter the encapsulant 112 in the mold chase 200 first.

A portion of the backing 304 and the carrier 306 extend past the exterior boundary 110 of the outermost IC 102 so that when turned over the portion rests on the protective layer 208 over the top surface of the walls 204, 206. The walls 204, 206 have a height that corresponds to a height of the ICs 102 so that little or no encapsulant covers the bottom surface 108 of the IC 102. A compressive force is applied with a compressive member 210. The compressive member 210 is sized and shaped to correspond to the mold chase 200 and is configured to hold the carrier 306 by vacuum suction. During compression, the mold chase 200 is under pressure to remove air. The encapsulant 112 wicks around the side surfaces 110 of the ICs 102 as the compressive member presses down and the air is removed. The encapsulant 112 covers all of the side surfaces 110 of the ICs and is substantially the same height as the ICs. The protective layer 208 protects the IC 102 from any damage or scratching that may be caused by the compression. It also absorbs some of the compression from the fluid resin 112, thus reducing the amount of stress placed on the die 102 during the molding process.

As the compressive member 210 presses the carrier and the integrated circuit into the mold chase 200, the integrated circuit is cushioned by the backing 304 on the top surface 106 and by the protective layer 208 on the bottom surface 108. The integrated circuit experiences non-compressive forces of the liquid encapsulant 112 only on the sides 110. Liquid is non-compressable and by having the backing 304 and layer 208 present, compressive forces on the sides of the die are reduced or eliminated. This significantly reduces the amount of compressive stress experienced by the integrated circuit, which in turn significantly reduces the problems of warpage during heating and cooling of the packaged integrated circuit. Further as the hot resin 112 cools to form a solid, stress from the effects of difference in CTE are greatly reduced.

In order to avoid excess encapsulant 112 in the mold chase and therefore excess encapsulant 112 over the backside 108 of the IC 102, the desired weight of the encapsulant is calculated, then weighed as it is put in the mold. Too much encapsulant 112 prevents the mold chase 200 and compressive member 210 from pressing down the desired amount and causes the final thickness of the encapsulant to be higher, so this is avoided.

Further processing steps may also be carried out. For example, the encapsulant may be heat-treated, cold-treated or otherwise processed in order to change the chemical or physical characteristics of the encapsulant 112. In one embodiment, the encapsulant 112 is cured in some manner. In other embodiments, other manufacturing processes for forming the layer of encapsulant 112 may be used.

Figure 8:
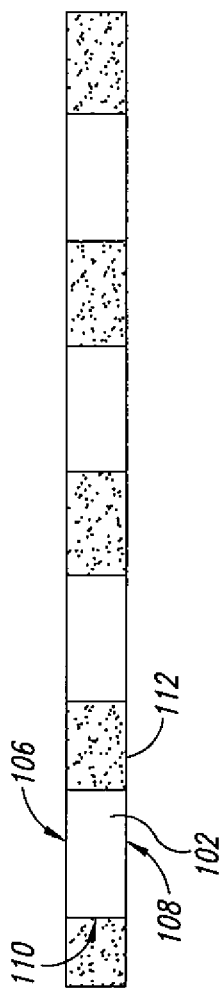
FIGS. 8-13 illustrate a second plurality of processing acts that may be used in manufacturing the fan-out wafer level packaging of FIG. 4, according to one embodiment.

The piece of tape 304 may then be removed, as illustrated in FIG. 8, to leave what is effectively an array of integrated circuits 102 encased in the layer of encapsulant 112. As described above, the top surface 106 of the integrated circuit 102 may have been facing towards the tape 304. As oriented in FIG. 8, the top surface 106 of the integrated circuit 102 is facing the top of the drawing. Upon removing the piece of tape 304, in one embodiment, the top surface 106 and the bottom surface 108 of the integrated circuit 102 are both exposed, and the layer of encapsulant 112 substantially covers four side surfaces 110 of the integrated circuit 102.

Figure 9:
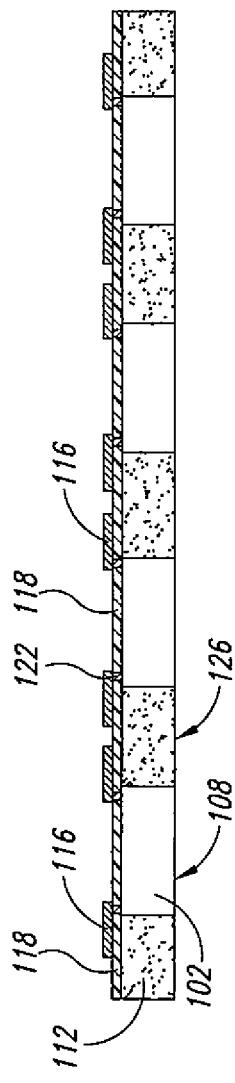

In one embodiment, as illustrated in FIG. 9, a first dielectric layer 118 may be formed extending at least partially over the top surface 106 of the integrated circuit 102. The first dielectric layer 118 may be formed to include at least one bond pad via 122 through which at least a portion of a bond pad of the integrated circuit 102 is exposed. These bond pad vias 122 may enable subsequent electrical connections to be formed between the bond pads of the integrated circuit 102 and one or more redistributed bond pads.

As described above, the first dielectric layer 118 may comprise any of a variety of dielectric materials. In one embodiment, the first dielectric layer 118 comprises a photosensitive polymer, such as polyimide, polybenzoxazole, or solder resist.

The first dielectric layer 118 may also be deposited and then patterned to form the bond pad vias 122 by any of a variety of processes. If the first dielectric layer 118 comprises a photosensitive polymer, the photosensitive polymer may first be coated over the layer of encapsulant 112 and integrated circuit 102. After this coating, in some embodiments, the first dielectric layer 118 is planarized. Portions of the first dielectric layer 118 may then be exposed to light (e.g., to ultraviolet light) to create a desired patterning in this layer 118. After the light exposure, the exposed portions of the first dielectric layer 118 may then be removed by application of a developer solvent if a positive photosensitive polymer is used, or the unexposed portions may be removed if a negative photosensitive polymer is used. Of course, in other embodiments, other patterning processes may be used. For example, a separate photoresist layer may be deposited on top of the first dielectric layer 118 in order to define and then transfer a desired pattern to the first dielectric layer 118.

Additional chemical, physical or thermal processing may be carried out to cure or harden the first dielectric layer 118. For example, the partially formed fan-out wafer level packaging 100 may be baked to cure the first dielectric layer 118.

As illustrated in FIG. 9, a redistribution layer 116 configured to electrically couple the bond pad of the integrated circuit 102 to a redistributed bond pad may also be formed. The redistribution layer 116 may comprise any of a variety of electrically conductive materials, as discussed above. As illustrated, the redistribution layer 116 may be formed over at least a portion of the first dielectric layer 118 and may fill at least partially the bond pad via 122. Thus, the redistribution layer 116 may create electrical connections between the bond pads of the integrated circuit 102 and one or more redistributed bond pads through the bond pad vias 122.

In one embodiment, after the first dielectric layer 118 has been formed, a seed layer (not shown) may first be sputtered over the first dielectric layer 118. The seed layer may comprise a metallic thin film, such as copper. This seed layer may thus extend over the entire exposed surface of the partially formed fan-out wafer level packaging 100. A patterned layer may then be formed over the seed layer using photolithography. Any of a variety of photolithographic techniques may be used to form such a patterned layer over the seed layer. The patterned layer may comprise, for example, photoresist material. The patterned layer may leave portions of the seed layer exposed in a pattern that will eventually define the pattern of the redistribution layer 116. At least a portion of the seed layer exposed through the patterned layer may then be plated to form the redistribution layer 116. For example, electrochemical plating or electroless plating may be performed to create a copper redistribution layer 116. The patterned layer may then be removed, and the remaining portions of the seed layer that were not plated may also be removed. Any of a variety of chemical or physical processes, such as wet etching, may be used to remove these layers, leaving the patterned redistribution layer 116. Of course, in other embodiments, other techniques for forming a patterned redistribution layer 116 may be used.

Figure 10:
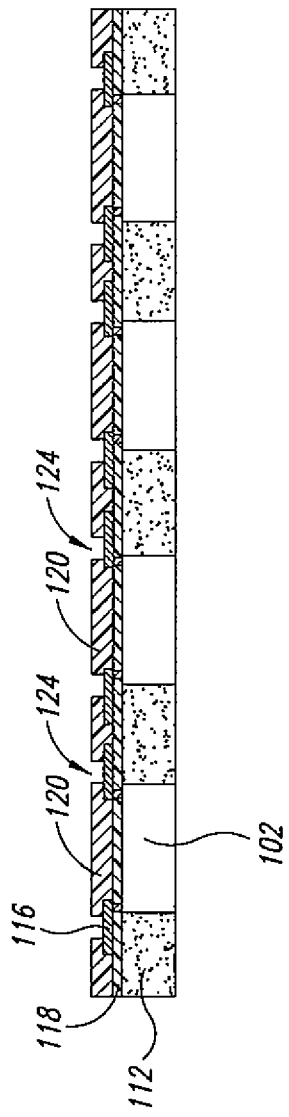

As illustrated in FIG. 10, once the redistribution layer 116 has been formed, a second dielectric layer 120 may be formed extending at least partially over the redistribution layer 116 and including at least one redistribution via 124 through which at least a portion of the redistribution layer 116 is exposed. These redistribution vias 124 may define the locations for one or more redistributed bond pads. As described above, in one embodiment, the redistribution layer 116 may itself define the redistributed bond pads. In other embodiments, a redistributed bond pad may be formed at least partially within a corresponding redistribution via 124, as described in greater detail below.

As described above, the second dielectric layer 120 may comprise any of a variety of dielectric materials. In one embodiment, the second dielectric layer 120 and the first dielectric layer 118 comprise the same material. For example, the second dielectric layer 120 may comprise a photosensitive polymer, such as polyimide, polybenzoxazole or solder resist.

The second dielectric layer 120 may be deposited and then patterned to form the redistribution vias 124 in a variety of ways. If the second dielectric layer 120 comprises a photosensitive polymer, the photosensitive polymer may first be coated over the redistribution layer 116 and exposed portions of the first dielectric layer 118. After this coating, in some embodiments, the second dielectric layer 120 is planarized. Portions of the second dielectric layer 120 may then be exposed to light (e.g., to ultraviolet light) to create the desired patterning in this layer 120. After the light exposure, the exposed portions of the second dielectric layer 120 may then be removed by application of a developer solvent if a positive photosensitive polymer is used, or the unexposed portions may be removed if a negative photosensitive polymer is used. Of course, in other embodiments, other patterning processes may be used. For example, a separate photoresist layer may be deposited on top of the second dielectric layer 120 in order to define and then transfer a desired pattern to the second dielectric layer 120.

Additional chemical, physical or thermal processing may be carried out to cure or harden the second dielectric layer 120. For example, the partially formed fan-out wafer level packaging 100 may be baked to cure the second dielectric layer 120.

Figure 11:
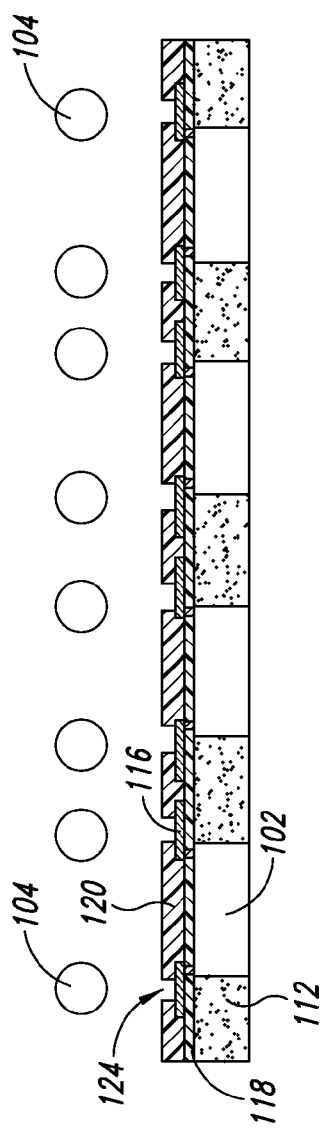

Bumps 104 may then be formed at the redistributed bond pad, as illustrated in FIG. 11. The bumps 104 may comprise any of a variety of conductive materials, as described above. In one embodiment, the bumps 104 may comprise lead-free bumps, although in other embodiments leaded bumps may be used.

In one embodiment, the redistributed bond pad may simply be defined by the portions of the redistribution layer 116 exposed through the redistribution vias 124, as illustrated in FIG. 11. In such an embodiment, the bumps 104 may be formed by conventional ball bonding techniques in direct contact with the redistribution layer 116. Thus, the bumps 104 may be formed on the partially formed fan-out wafer level packaging 100 to form the completed fan-out wafer level packaging 100 of FIG. 4.

In other embodiments, after forming the second dielectric layer 120, a redistributed bond pad may be formed at least partially within the redistribution via 124. Such a redistributed bond pad may comprise an under-bump-metallurgy layer configured to facilitate the electrical connection formed between the bump 104 and the redistribution layer 116. This redistributed bond pad may be formed by a variety of processes. In one embodiment, the redistributed bond pad may be formed by sputtering a compound of either: (a) titanium, nickel and copper, or (b) aluminum, nickel and copper. The sputtered compound may then be plated with a compound of either: (a) titanium and copper, (b) titanium, tungsten and copper, or (c) chromium and copper. In another embodiment, the redistributed bond pad may be formed by plating the exposed redistribution layer 116 with at least one of: (a) copper, (b) nickel, or (c) copper and nickel.

Figure 12:
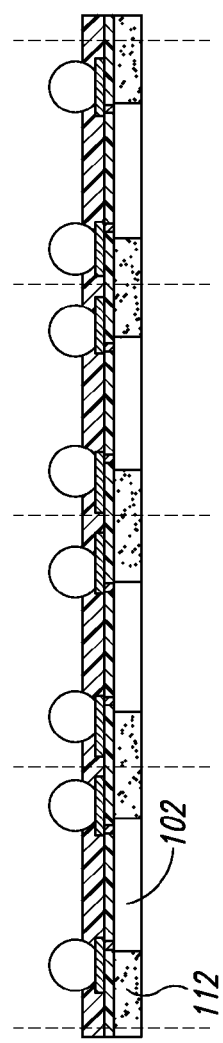

After the bump 104 is connected to the redistribution layer 116, the bottom surface, i.e., the backside of the IC 102 is thinned and planarized. FIG. 12 illustrates planarization of the ICs 102. In one embodiment, portions of the encapsulant layer 112 and the inactive region of the integrated circuit 102 that is exposed or covered by a thin layer of encapsulant is ground away leaving 450 microns of the ICs. The vertical dotted lines illustrate where a die cutter or laser may singulate the ICs 102.

Figure 1:
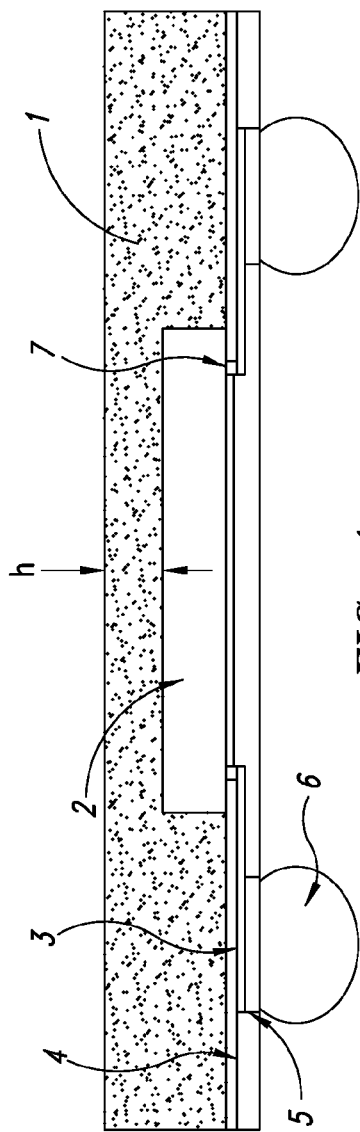
FIG. 1 is a cross-sectional, side, schematic view of prior art fan-out wafer level packaging.
Figure 13:
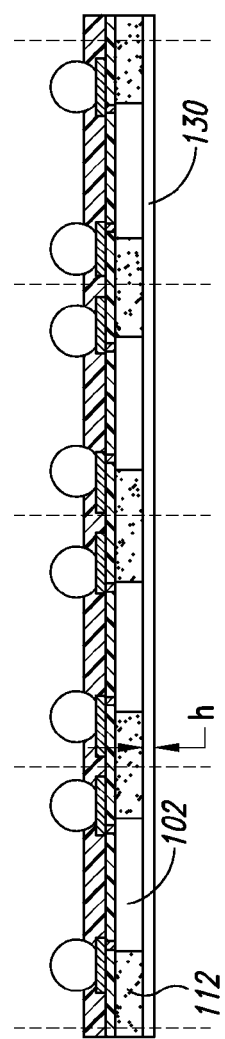

FIG. 13 illustrates an alternative embodiment, where a backside coating 130 protects the bottom surface 108 of the ICs 102 prior to singulation. The backside coating 130 may be an epoxy or other material suitable for protecting the bottom surface 108 of the IC from damage. Additionally or alternatively, the backside coating may have a similar coefficient of thermal expansion as the silicon of the IC 102. The layer 130 can be thin, so that if it has a CTE different from the die 102, there is little to no additional stress put on the die 102 when it goes through heating and cooling cycles. Another way to achieve this is to have the same CTE for both materials, while yet another way is to have no layer over the back side 108. Usually, a prior art die would have height h between 800 and 2000 microns of resin above the bottom surface of the die (see FIG. 1). In the standard packing of the prior art, a resin height h of 1000 microns is common. When the package is repeatedly heated and cooled, this huge bulk of resin, having a different CTE than the die 102, will put repeated stress on the die. On the other hand, one embodiment of the present invention has no resin on the back side of the die, avoiding the issue completely. In some embodiments, a thin layer of material under 120 microns and preferably in the range of about 40 to 90 microns of material 130 is on the back side 108 of the die, with 80 microns being preferred.

The material 130 can be a type of material having a CTE that is closer to that of the die than the encapsulating resin 112, thus providing even less stress. It can also be an epoxy, a polymer, or other material which, even though the CTE is different from the die, the height "h" is in the range of about 80 to 100 microns, thus not providing large stress on the die during heating and cooling cycles.

The completed fan-out wafer level packaging 100 is illustrated in FIG. 4. After completing the processing acts described above upon a plurality of contiguous packaging, the resulting wafer may be tested and then singulated to form the individual fan-out wafer level packaging 100 (e.g., via dicing or laser-cutting), as shown in FIGS. 12 and 13. In other embodiments, the packaging 100 may have been singulated at an earlier stage in the process.

In one embodiment, the fan-out wafer level packaging 100 may be coupled to one or more additional chip packages or electronic devices via the bumps 104.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more programs executed by one or more processors, as one or more programs executed by one or more controllers (e.g., microcontrollers), as firmware, or as virtually any combination thereof, and that designing the circuitry and/or writing the code for the software and or firmware would be well within the skill of one of ordinary skill in the art in light of this disclosure.

When logic is implemented as software and stored in memory, one skilled in the art will appreciate that logic or information can be stored on any computer readable storage medium for use by or in connection with any processor-related system or method. In the context of this document, a memory is a computer readable storage medium that is an electronic, magnetic, optical, or other physical device or means that contains or stores a computer and/or processor program and/or data or information. Logic and/or the information can be embodied in any computer readable storage medium for use by or in connection with an instruction execution system, apparatus, or device, such as a computer-based system, processor-containing system, or other system that can fetch the instructions from the instruction execution system, apparatus, or device and execute the instructions associated with logic and/or information.

The various embodiments described above can be combined to provide further embodiments. From the foregoing it will be appreciated that, although specific embodiments have been described herein for purposes of illustration, various modifications may be made without deviating from the spirit and scope of the teachings. Accordingly, the claims are not limited by the disclosed embodiments.

The invention claimed is:

1. A method, comprising:
packaging an integrated circuit die, the integrated circuit die having an active surface and an inactive surface that is substantially parallel to the active surface and a plurality of sides that extend between the active surface and the inactive surface, the packaging including:
positioning the active surface of the integrated circuit die on a first surface;
positioning the inactive surface of the integrated circuit die in an encapsulant in a mold chamber;
covering only the plurality of sides of the integrated circuit die with the encapsulant by compressing the first surface towards the encapsulant in the mold chamber; and
preventing the encapsulant from covering the inactive surface and the active surface of the integrated circuit die by compressing the inactive surface of the integrated circuit die into a resilient surface in the mold chamber.

2. The method of claim 1 wherein preventing the encapsulant from covering the inactive surface includes directly contacting the inactive surface of the integrated circuit die with the resilient surface in the mold chamber.

3. The method of claim 2 wherein preventing the encapsulant from covering the inactive surface includes controlling a rate of the compressing.

4. The method of claim 2, further comprising removing the integrated circuit die from the molding chamber and removing the first surface from the integrated circuit die, a height of the encapsulant being equal to a height of an integrated circuit die.

5. The method of claim 4, further comprising coupling a redistribution layer to a bond pad of the integrated circuit die.

6. The method of claim 1 wherein the first surface is adhesive.

7. A method, comprising:
providing a molding chamber, the molding chamber having an interior bottom surface;
forming an encapsulant around only sides of an integrated circuit die in the molding chamber, the integrated circuit die having a top surface and a bottom surface that is substantially parallel to the top surface, the sides that extend between the top surface and the bottom surface, the forming including:
attaching the bottom surface of the integrated circuit die to a support plate;
compressing the top surface of the integrated circuit die into a resilient material on the interior bottom surface of the molding chamber by providing pressure to the support plate, the resilient material including a first lower portion and a second upper portion, the first lower portion being formed on the interior bottom surface, the first lower portion is spaced from the second upper portion by a first distance, the top surface of the integrated circuit being spaced from the bottom surface by a second distance that is substantially equal to the first distance.

8. The method of claim 7 wherein forming the encapsulant includes providing the encapsulant before compressing the top surface into the resilient material.

9. The method of claim 8 wherein forming the encapsulant around the sides of the integrated circuit die includes maintaining the encapsulant in a liquid state by controlling a temperature of the encapsulant in the molding chamber.

10. The method of claim 9 wherein the top surface of the integrated circuit die directly contacts the first lower portion of the resilient material.

11. The method of claim 7 wherein forming the encapsulant includes providing the encapsulant after the top surface of the integrated circuit is brought into contact with the resilient material of the molding chamber.

* * * * *